(12) United States Patent
Llapitan et al.

(10) Patent No.: US 7,050,302 B2
(45) Date of Patent: May 23, 2006

(54) CAPTIVE SOCKET ACTUATOR

(75) Inventors: David J. Llapitan, Puyallup, WA (US); Alan W. Tate, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/836,442

(22) Filed: Apr. 29, 2004

(65) Prior Publication Data

US 2005/0243525 A1   Nov. 3, 2005

(51) Int. Cl.
*H05K 7/20* (2006.01)

(52) U.S. Cl. ............ 361/704; 361/709; 361/719; 257/718; 257/719; 257/727; 165/80.3; 165/185; 174/16.1; 174/16.3

(58) Field of Classification Search ........ 361/702–707, 361/709–711, 717–719; 257/706, 712, 718–727; 165/80.3, 185; 174/16.3; 439/342, 259
See application file for complete search history.

(56) References Cited

U.S. PATENT DOCUMENTS

| | | | |
|---|---|---|---|
| 5,828,551 A * | 10/1998 | Hoshino et al. ............ 361/697 |
| 6,118,659 A * | 9/2000 | Adams et al. ............. 361/704 |
| 6,159,031 A | 12/2000 | Llapitan et al. |
| 6,219,241 B1 * | 4/2001 | Jones ......................... 361/704 |
| 6,327,147 B1 | 12/2001 | Llapitan et al. |
| 6,392,889 B1 | 5/2002 | Lee at al. |
| 6,401,807 B1 * | 6/2002 | Wyler et al. ................ 165/121 |
| 6,477,051 B1 * | 11/2002 | Barsun ....................... 361/704 |
| 6,515,862 B1 * | 2/2003 | Wong et al. ................ 361/710 |
| 6,585,534 B1 | 7/2003 | Llapitan et al. |
| 6,671,172 B1 | 12/2003 | Carter et al. |
| 6,704,195 B1 * | 3/2004 | Cravens et al. ............ 361/687 |
| 6,722,908 B1 | 4/2004 | Llapitan et al. |
| 6,781,838 B1 * | 8/2004 | Shinotou ................... 361/704 |
| 6,866,540 B1 * | 3/2005 | Robertson .................. 439/488 |
| 6,898,083 B1 * | 5/2005 | Hornung .................... 361/704 |
| 2002/0176228 A1 | 11/2002 | Lin |
| 2003/0048612 A1 | 3/2003 | Carter et al. |
| 2003/0214784 A1 | 11/2003 | Pauser |
| 2004/0045163 A1 | 3/2004 | Carter et al. |
| 2004/0063343 A1 | 4/2004 | Murr |
| 2004/0080914 A1 | 4/2004 | Carter et al. |

\* cited by examiner

*Primary Examiner*—Boris Chervinsky
(74) *Attorney, Agent, or Firm*—Schwabe, Williamson & Wyatt, P.C.

(57) ABSTRACT

Illustrative embodiments of the present invention include, but are not limited to, a heat sink equipped with a captive socket actuating device designed to facilitate engagement and disengagement of the apparatus to and from an integrated circuit (IC) socket.

23 Claims, 6 Drawing Sheets

CAPTIVE SOCKET ACTUATOR

FIELD OF THE INVENTION

Disclosed embodiments of the present invention relate to integrated circuits. More specifically, embodiments of the present invention related to a captive actuator for integrated circuit socket.

BACKGROUND INFORMATION

As integrated circuit (IC) processing technologies continue to improve, the number of devices that may be incorporated into such ICs also increases. Although increasing the number of devices in an IC typically results in greater performance, the increased number of devices is too often accompanied by an increase in heat generation. Unfortunately, such heat generation can be detrimental to IC's and especially to processors unless the heat is dissipated or otherwise drawn away from the IC.

Heat sinks are devices that are often used to promote heat dissipation from ICs. In the past, when ICs packages were relatively small, the size of the heat sinks used to cool such ICs was roughly the same as the size of the IC package that the heat sink was designed to cool. This made the processes of connecting and removing the IC package to and from a printed circuit board socket manageable. However, with the increased heat generation accompanying today's processors for example, the physical size of the heat sinks required to dissipate such heat has also increased dramatically. Unfortunately, such large heat sinks can easily eclipse the size of the IC packages they were intended to cool, making insertion and removal of the ICs from a circuit board or system difficult.

In modern day computing systems for example, heat sinks are typically mounted on processor packages they are designed to cool. Typically, these processor/heat sink assemblies are then connected and disconnected from circuit boards by way of a releasable processor socket sometimes referred to as a zero insertion force (ZIF) socket. Unfortunately, however, separate tools are often required to engage/disengage a processor/heat sink assembly from a corresponding socket. This can cause installation difficulties and resulting manufacturing delays for motherboard and OEM system integrators when the required tool is not readily locatable. Moreover, even with the requisite tool available, due to the large size of today's heat sink assemblies, obtaining access to the release mechanisms of the processor socket can be difficult and time consuming.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

Illustrative embodiments of the present invention include, but are not limited to, an apparatus such as a heat sink equipped with a captive socket actuating device designed to facilitate engagement and disengagement of the apparatus to and from an integrated circuit (IC) socket.

In the following detailed description, numerous specific details are set forth in order to provide a thorough understanding of embodiments of the present invention. However, those skilled in the art will understand that such embodiments may be practiced without these specific details. In other instances, well known methods, procedures, components, and circuits have not been described in detail.

Although various discrete operations will be described herein, the mere order of description should not be construed as to imply that these operations are necessarily performed in the order they are presented.

Furthermore, reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention, although they may. Moreover, the particular features, structures, or characteristics described may be combined in any suitable manner in one or more embodiments. Lastly, the terms "comprising", "including", "having", and the like, as used in the present application, are intended to be synonymous.

Figures 1, 2, 3:
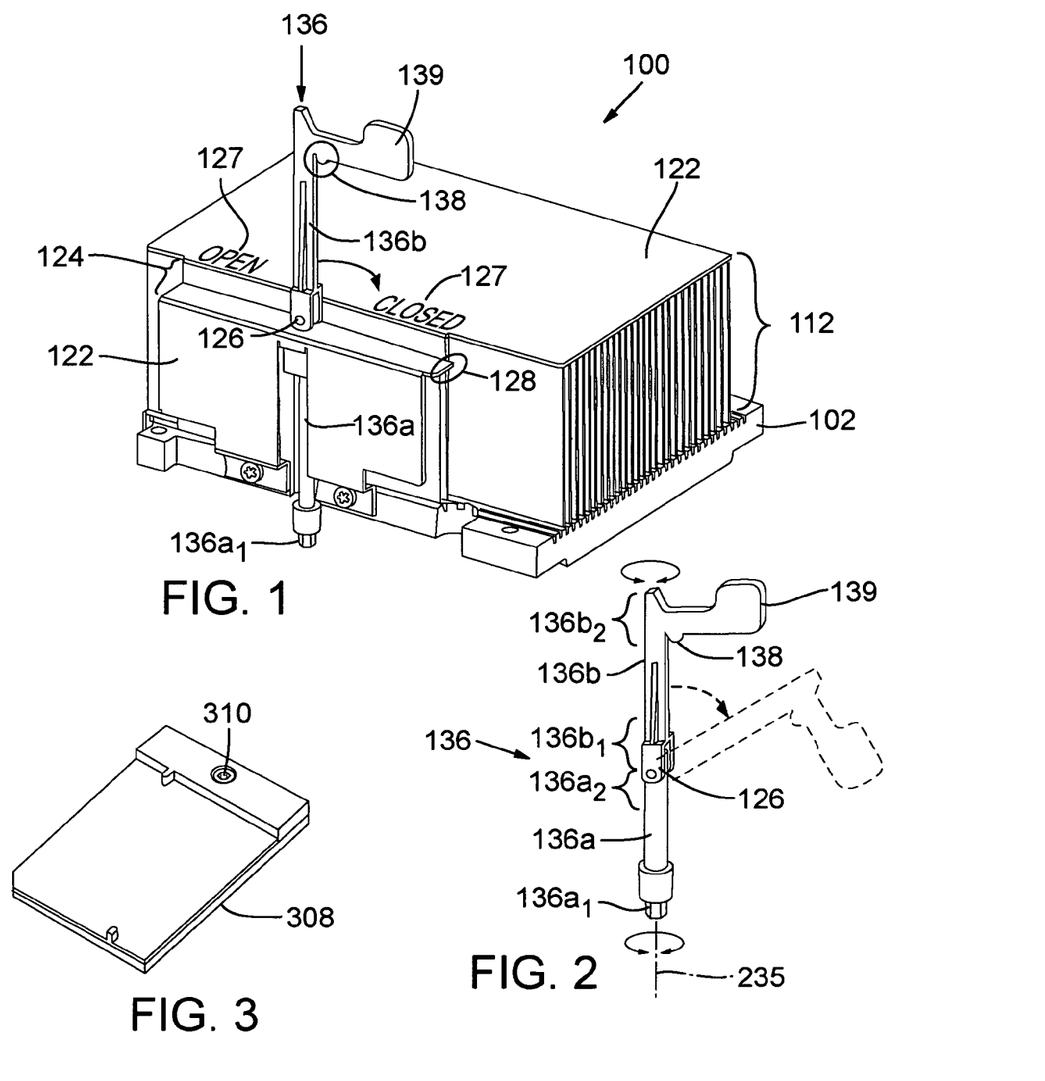
FIG. 1 illustrates a heat sink assembly including a captive socket actuator in accordance with one embodiment of the invention.
FIG. 2 illustrates one embodiment of a socket actuator.
FIG. 3 illustrates an example processor socket to be engaged by a socket actuator in accordance with embodiments of the invention.

FIG. 1 illustrates a heat sink assembly including a captive socket actuator in accordance with one embodiment of the invention. In one embodiment, heat sink assembly 100 is equipped with socket actuator 136 to facilitate engagement and disengagement of heat sink assembly 100 to and from a corresponding IC socket without the need for or use of external tools. Heat sink assembly 100 may be used with a variety of electronic packages, ICs including processors, and connectors.

In the illustrated embodiment of FIG. 1, heat sink assembly 100 includes base 102, cooling fins 112, shroud 122 and socket actuator 136 coupled together as shown. In one embodiment, heat sink assembly 100 may be thermally coupled to an IC to promote heat dissipation from the IC to the ambient via base 102 and cooling fins 112. Shroud 122 may be thermally coupled to both cooling fins 112 and base 102 to further increase the heat dissipation properties of heat sink assembly 100. In one embodiment, base 102, cooling fins 112 and shroud 122 may be constructed from a number of materials such as copper, aluminum or equivalents having e.g. a high measure of thermal conductivity.

In accordance with one embodiment of the invention, shroud 122 may be advantageously equipped in rotatable communication with socket actuator 136. In one embodiment, socket actuator 136 is adapted to actuate a processor socket to cause the processor socket to engage and disengage a corresponding processor. In one embodiment, heat sink assembly 100 may be placed in thermal communication with an IC prior to insertion of the processor into a corresponding IC socket. For example, heat sink assembly 100 may be thermally coupled to an IC via a thermally conductive adhesive or other retention mechanism that maintains the IC in thermal proximity to heat sink assembly 100 to facilitate heat dissipation from the IC. In another embodiment, heat sink assembly 100 and the processor may be independently movable such that heat sink assembly 100 may be placed in thermal communication with the IC after the IC has been inserted into a corresponding IC socket.

FIG. 2 illustrates one embodiment of socket actuator 136, whereas FIG. 3 illustrates an example IC socket to be engaged by socket actuator 136 in accordance with embodiments of the invention. In one embodiment, IC socket 308 represents a zero insertion force (ZIF) socket into which an integrated circuit such as a processor may be inserted with minimal pressure while the socket is in an open state. Upon the socket being closed (e.g. via socket actuator 136), contacts within the socket are caused to grip or engage the pins of the corresponding IC.

Socket actuator 136 may include a first member 136a (having first end 136a1 and second end 136a2), and a second member 136b (having a first end 136b1 and second end 136b2) which are joined together at or near pivot point 126. In one embodiment, end 136a1 of socket actuator 136 is adapted to be received by receptacle 310 of IC socket 308 to cause (e.g., actuate) IC socket 308 to engage or disengage a corresponding IC. In one embodiment, end 136a1 may be hexagonal in shape to engage a corresponding hexagonal receptacle 310 of IC socket 308. However, end 136a1 may be differently adapted depending e.g., upon the corresponding structure of socket receptacle 310

In one embodiment, socket actuator 136 may be at least partially rotatable about rotational axis 235 and at least partially articulable about pivot point 126. In one embodiment, while in communication with socket receptacle 310, socket actuator 136 may be rotated in a first direction around rotational axis 235 to cause IC socket 308 to engage an IC such as a processor. Similarly, socket actuator 136 may be rotated in a reverse direction around rotational axis 235 to cause IC socket 308 to disengage an IC such as a processor. In one embodiment, socket actuator 136 may be rotated +/−180 degrees about rotational axis 235. In one embodiment, socket actuator 136 is equipped with handle 139 to facilitate ergonomic rotation of socket actuator 136 around axis 235 to cause IC socket 308 to engage and disengage an IC. In accordance with one embodiment of the invention, shroud 122 may be equipped with nomenclature 127 (of FIG. 1) to indicate, based upon a position of handle 139, whether IC socket 308 is in an closed, engaging position, or whether IC socket 308 is in an open, non-engaging position.

In one embodiment, member 136b of socket actuator 136 may be articulable about pivot point 126. As such, member 136b may be placed in a first upright or extended position (illustrated in FIG. 1) to facilitate user rotation of socket actuator 136 via handle 130. Additionally, member 136b may be placed in a second seated position in preparation for storage or shipping of a system incorporating heat sink assembly 100 for example. In one embodiment, shroud 122 may include stepped surface 124 which may be adapted to receive member 136b into a seated, substantially horizontal position as shown e.g. in FIG. 7b (discussed below). In one embodiment, socket actuator 136 may be further equipped with snap 138 while shroud 122 may be further equipped with tab 128 to cooperatively secure member 136b in the seated position via snap 138.

Figure 4:
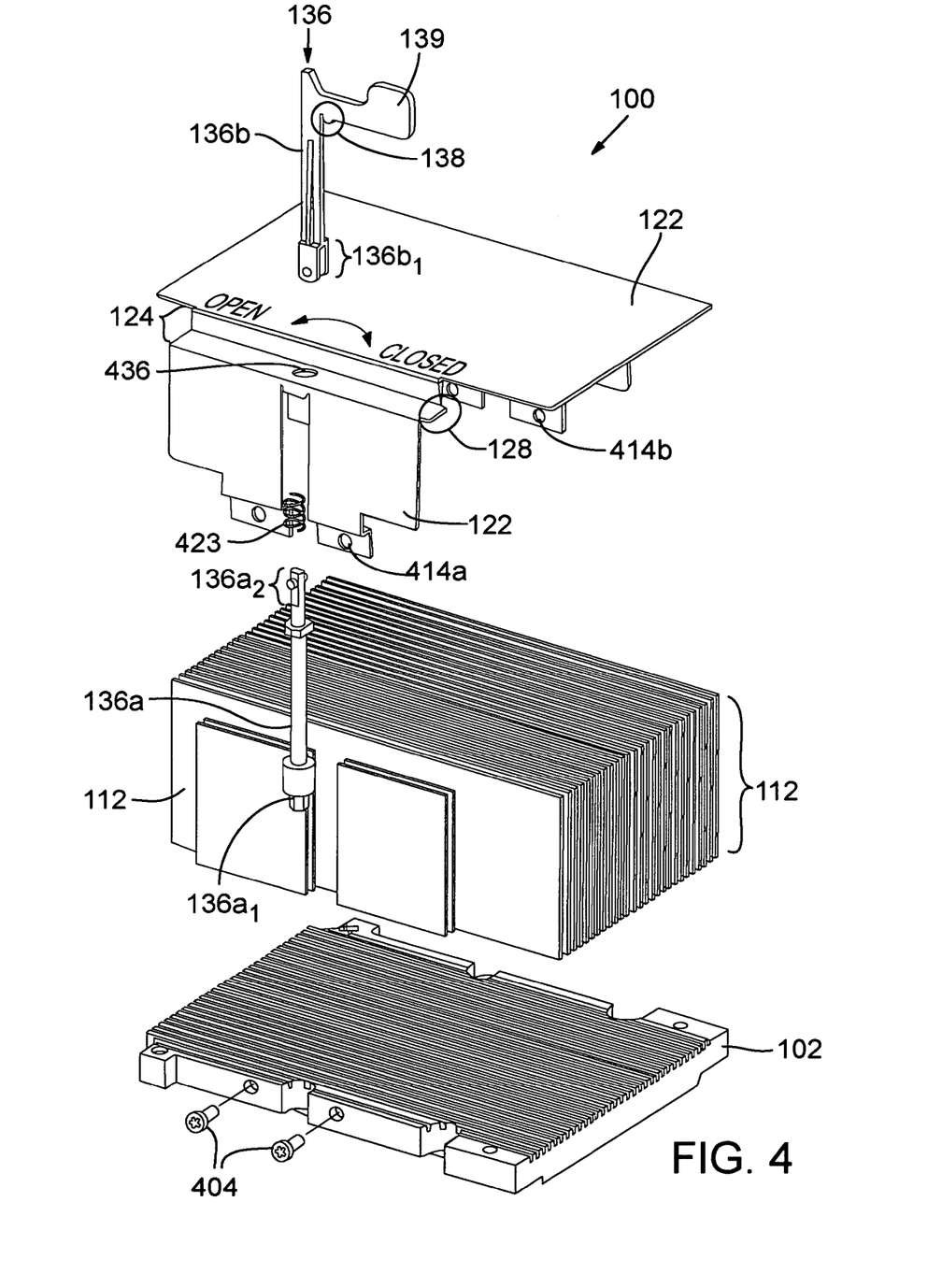
FIG. 4 illustrates an exploded view of a heat sink assembly in accordance with one embodiment of the present invention.

FIG. 4 illustrates an exploded view of heat sink assembly 100 in accordance with one embodiment of the present invention. As shown, end 136a2 of member 136a may be inserted through opening 436 in shroud 122 for connection with member 136b at end 136b1. In one embodiment, member 136a may be downwardly biased away from member 136b via a biasing mechanism such as coil spring 423 or equivalent device to assist in the engagement of 136a2 with receptacle 310. In one embodiment, shroud 122 may be coupled to base 102 via one or more physical, mechanical or chemical methods of connection. For example, fasteners 404 may be used to secure shroud 122 to base 102 via through-holes in tabs 414a and 414b. Alternatively, shroud 122 may be soldered to, or otherwise affixed to base 102 without the use of a mechanical fastener. In an alternative embodiment, shroud 122 may be thermally coupled to cooling fins 112, which in turn may be coupled to base 102.

Figure 5:
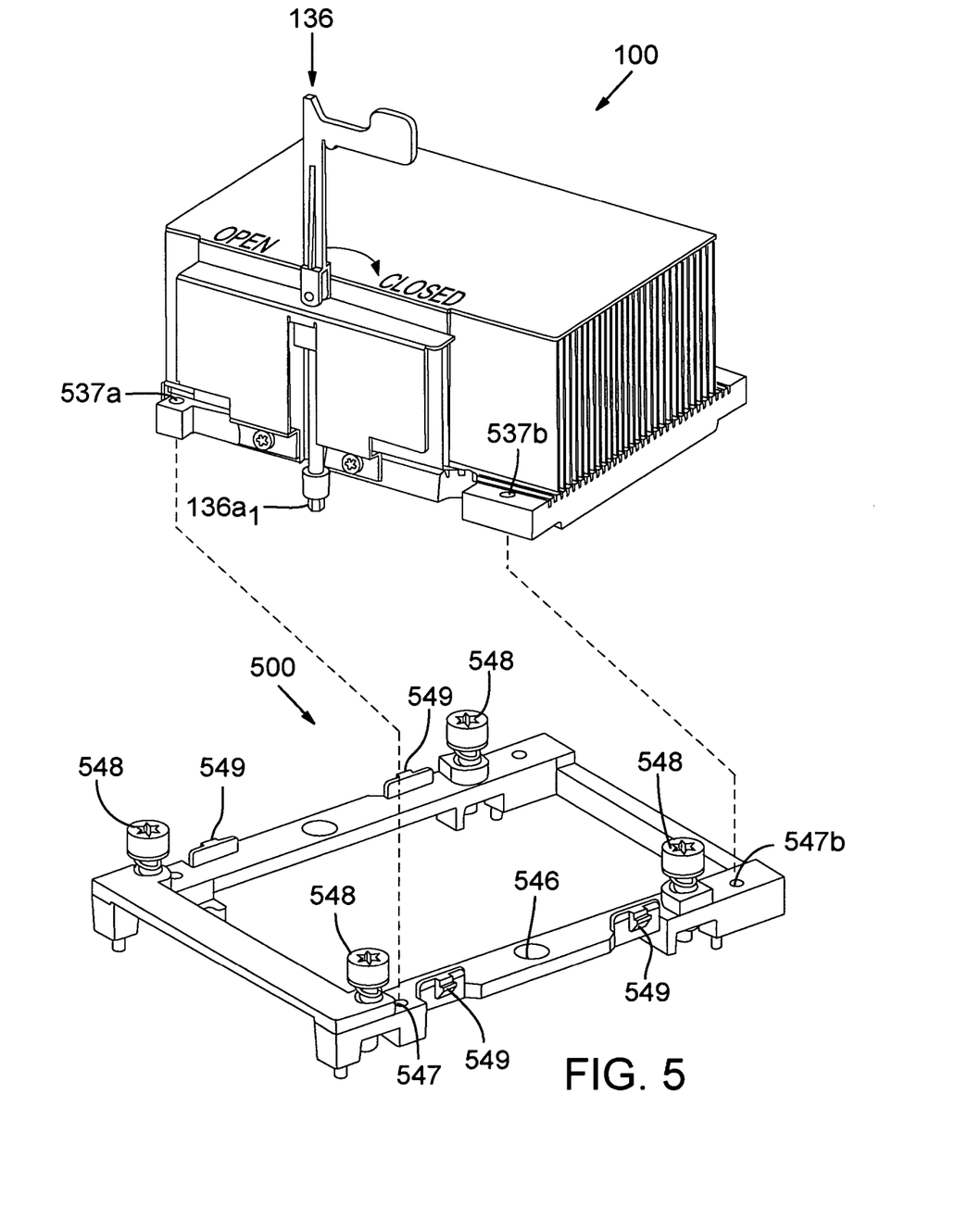
FIG. 5 illustrates one embodiment of a stiff plate assembly for connection to a heat sink assembly.

FIG. 5 illustrates one embodiment of a stiff plate assembly 500 for connection to heat sink assembly 100. In one embodiment, stiff plate assembly 500 may facilitate connection of heat sink assembly 100 to a circuit board, such as circuit board 602 of FIG. 6 (discussed below). Stiff plate assembly 500 may further provide additional structural rigidity to heat sink assembly 100. In one embodiment, heat sink assembly 100 may be seated on top of stiff plate assembly 500 such that end 136a1 of socket actuator 136 may pass through retaining hole 546 for engagement with receptacle 310 of IC socket 308. Additionally, stiff plate assembly 500 may include retention clips 549 for use in securing an IC within stiff plate assembly 500 such that when heat sink assembly 100 is coupled to stiff plate assembly 500, heat sink assembly 100 is thermal coupled to the IC. In one embodiment, fasteners may be used to couple heat sink assembly 100 to stiff plate assembly 500 via through-holes 537a,b and holes 547a,b. Furthermore, stiff plate assembly 500 may be coupled to a circuit board or board stiffener via fasteners 548.

Figure 6:
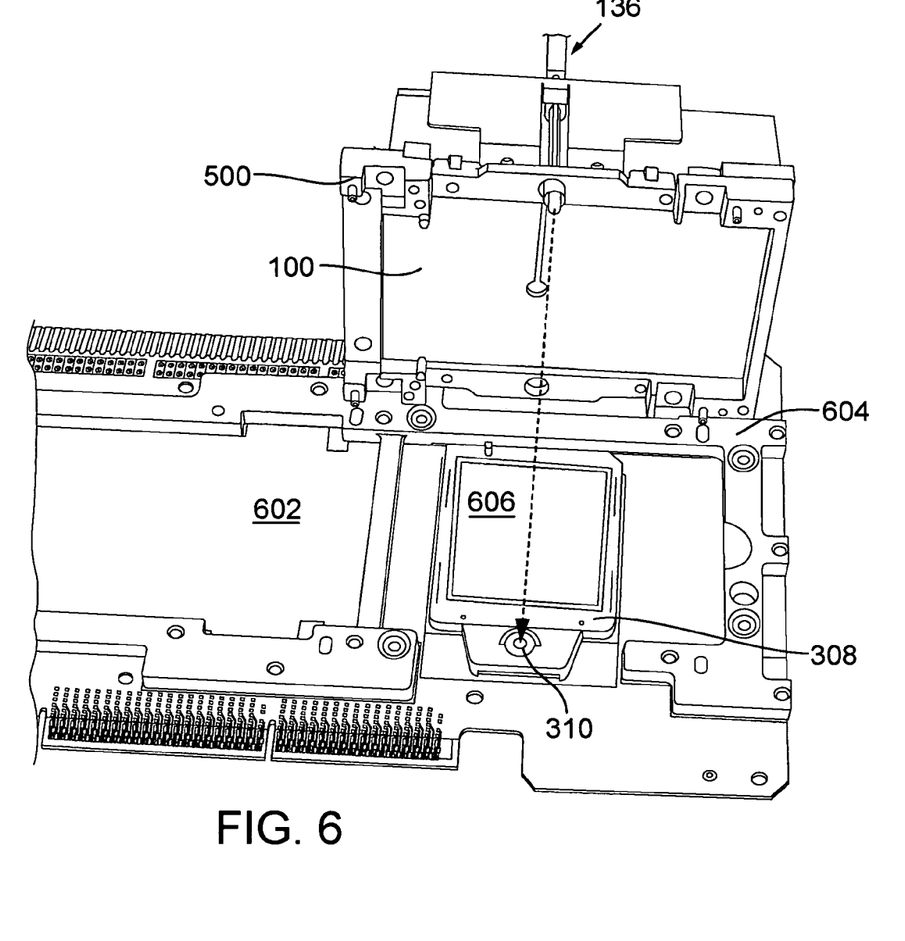
FIG. 6 illustrates an example circuit board having a processor socket located thereon for connection with a heat sink assembly in accordance with one embodiment of the invention.

FIG. 6 illustrates an example circuit board having an IC socket located thereon for connection with heat sink assembly 100 in accordance with one embodiment of the invention. In the illustrated embodiment, IC 606 is seated within IC socket 308 so as to be communicatively coupled with circuit board 602. In one embodiment, circuit board 602 may represent a printed circuit board such as a motherboard, daughterboard, or other expansion board/card for use within a computing system. Board stiffener 604 may provide structural rigidity to circuit board 602 and may further facilitate positioning of stiff plate assembly 500 and heat sink assembly 100 in communication with circuit board 602 such that socket actuator 136 may engage receptacle 310 as described above.

Figure 7A:
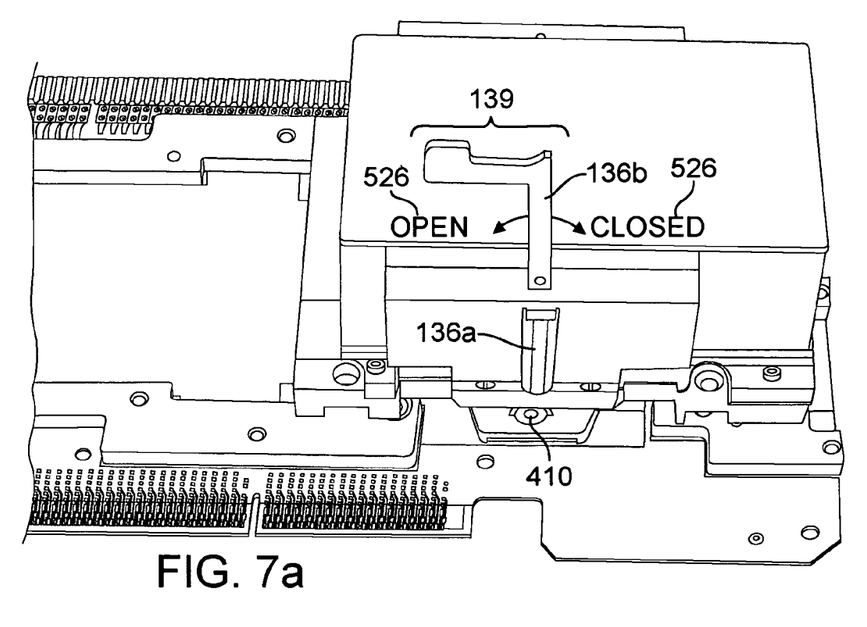
FIGS. 7a and 7b illustrate example operation of a socket actuator in accordance with one embodiment of the invention.
Figure 7B:
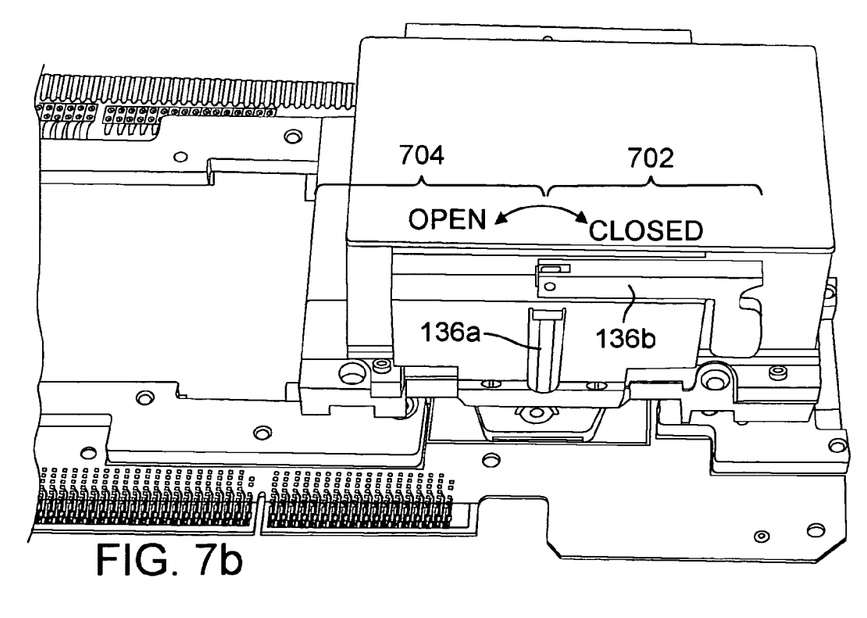

FIGS. 7a and 7b illustrate an example operation of socket actuator 136 in accordance with one embodiment of the invention. FIG. 7a illustrates socket actuator 136 in an extended position where member 136b is positioned in a substantially vertical arrangement with respect to member 136a. In one embodiment, handle 139 provides a simple and ergonomic means for a user to rotate socket actuator 136 from an open position where the IC socket is not engaged with a corresponding IC, to a closed position where the IC socket is engaged with a corresponding IC. In one embodiment, handle 139 may further indicate the connection state of the IC socket (e.g. open or closed) based upon nomenclature 526. FIG. 7b illustrates socket actuator 136 in a seated position where member 136b is positioned in a substantially horizontal arrangement with respect to member 136a. As shown, member 136a is seated within stepped surface 124 of shroud 122 such that member 136b may be prevented from unintentionally rotating in a counterclockwise direction by heat sink assembly 100. As such, member 136b may be prevented from unintentionally causing IC socket 308 to disengage a corresponding IC during shipping for example. Additionally, snap 138 and tab 128 may cooperatively prevent member 136b from unintentionally transitioning to an extended position where socket actuator 136 may then be unintentionally rotated into an open position. Furthermore, in accordance with one embodiment, the length (702) of member 136b is such that if member 136b were to be accidentally seated within stepped surface 124 in an open position (e.g., where an IC is not engaged by IC socket 308), member 136b would extend beyond the body of heat sink assembly 100 as shown by reference 704. Accordingly, this may act as an additional visual indication (e.g. to a system integrator) that IC socket 308 is in an open, non-engaging state.

Figure 8:
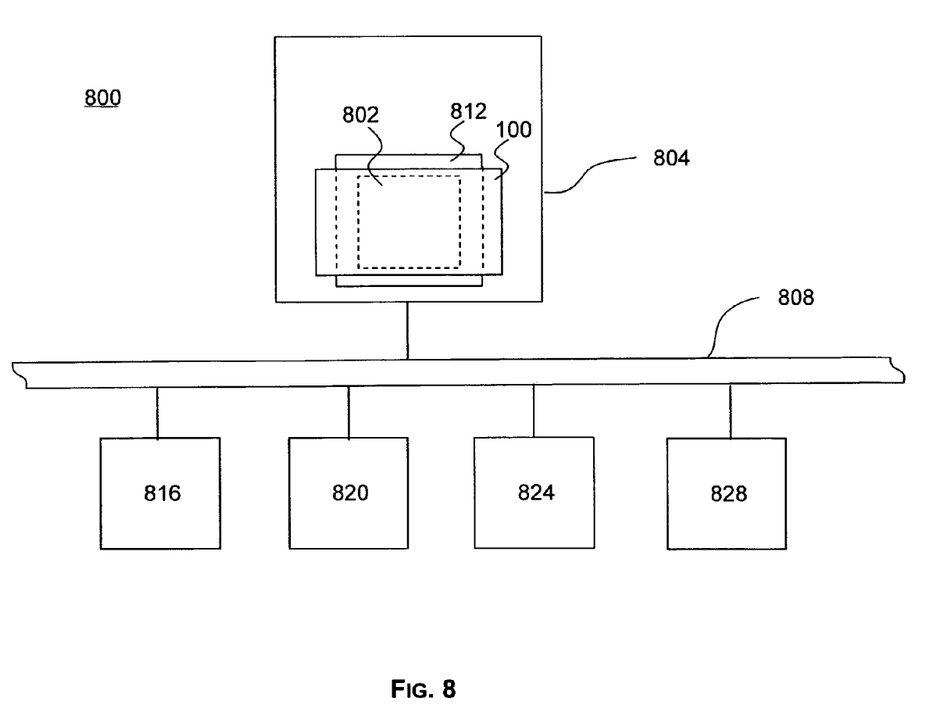
FIG. 8 illustrates a block diagram of an example electronic system within which at least one heat sink assembly may be utilized in accordance with one embodiment of the invention.

FIG. 8 illustrates a block diagram of an example electronic system 800 within which at least one heat sink assembly 100 (as illustrated in FIGS. 1–7) may be utilized. Heat sink assembly 100 may form a part of an electronic assembly 804 that is coupled to a bus 808. In one embodiment, the electronic assembly 804 may include a processor 802, a processor socket 812 to receive the processor, and heat sink assembly 100, which may be releasably coupled to processor socket 812. As used herein, processor means any type of circuit such as, but not limited to, a microprocessor, a graphics processor, and a digital signal processor. Alternatively, other types of circuits including integrated circuits can be included in electronic assembly 804.

The electronic system 800 may also include a main memory 816, a graphics processor 820, a mass storage device 824, and an input/output module 828 coupled to each other by way of the bus 808, as shown. Examples of the memory 816 include, but are not limited to, static random access memory (SRAM) and dynamic random access memory (DRAM). Examples of the mass storage device 824 include, but are not limited to, a hard disk drive, a compact disk drive (CD), a digital versatile disk drive (DVD), and so forth. Examples of the input/output module 828 include, but are not limited to, a keyboard, a cursor control device, a display, a network interface, and so forth. Examples of the bus 808 include, but are not limited to, a peripheral control interface (PCI) bus, and an industry standards architecture (ISA) bus, and so forth. In various embodiments, system 800 may be a wireless mobile phone, a personal digital assistant, a personal computer (PC), a network router, a set-top box, an audio/video controller, a DVD player, and a server.

Although specific embodiments have been illustrated and described herein, it will be appreciated by those of ordinary skill in the art that a wide variety of alternate and/or equivalent implementations calculated to achieve the same purposes may be substituted for the specific embodiment shown. This application is intended to cover any adaptations or variations of the embodiments discussed herein.

What is claimed is:

1. An apparatus comprising:
 a heat sink; and
 an actuator rotatably coupled to the heat sink to facilitate engagement and disengagement of an integrated circuit socket, wherein the actuator comprises:
  a first member having a first end and a second end; and
  a second member having a third end and a fourth end, the second member pivotally coupled to the first member at the second and third ends, wherein the first end is adapted to engage a receptacle within the integrated circuit socket to cause the integrated circuit socket to engage or disengage an integrated circuit.

2. The apparatus of claim 1, wherein the fourth end is adapted to indicate whether the integrated circuit is engaged or disengaged by the integrated circuit socket.

3. The apparatus of claim 1, wherein the actuator is at least partially rotatable about a rotational axis and at least partially articulable about a pivot point.

4. The apparatus of claim 1, wherein when the integrated circuit is engaged by the integrated circuit socket, the second member can be pivoted into a secured position such that the first member is prevented from rotating.

5. The apparatus of claim 4, wherein the actuator comprises a hex head to be received by the integrated circuit socket.

6. The apparatus of claim 1, wherein the actuator is rotatable about a vertical axis substantially perpendicular to the integrated circuit socket.

7. The apparatus of claim 1, wherein the integrated circuit socket comprises a processor socket.

8. An apparatus comprising:
 a heat sink; and
 an actuator rotatably coupled to the heat sink to facilitate engagement and disengagement of an integrated circuit socket, wherein the actuator comprises a first end and a second end, the first end adapted to engage a receptacle within the integrated circuit socket to cause the integrated circuit socket to engage or disengage an integrated circuit as indicated by the second end, the second end adapted to engage a securing mechanism on a shroud of the heat sink to secure at least a portion of the actuator.

9. The apparatus of claim 8, wherein the actuator further comprises a handle at the second end to facilitate rotation of the actuator in a first plane from a first position corresponding to engagement of the processor by the processor socket through a 180 degree rotation to a second position corresponding to disengagement of the processor by the processor socket.

10. The apparatus of claim 9, wherein the heat sink comprises first nomenclature corresponding to the first position to indicate that the processor is engaged by the processor socket, and second nomenclature corresponding to the second position to indicate that the processor is disengaged by the processor socket.

11. The apparatus of claim 8, wherein the first end is hexagonal in shape.

12. A heat sink comprising:
 a base;
 a plurality of crimped cooling fins thermally coupled to the base;
 a shroud coupled to at least the base; and
 a socket actuator coupled to the shroud, wherein the socket actuator further comprises:
  a first member and a second member pivotally coupled to each other at a pivot point between the first and second ends, wherein the second member is pivotable from a first substantially vertical position to a second substantially horizontal position.

13. The heat sink of claim 12, wherein the shroud is adapted to receive the second member in the second substantially horizontal position such that the second member is prevented from rotating about an axis defined by the first member when the processor socket is in the closed position.

14. The heat sink of claim 12, wherein the shroud comprises first nomenclature corresponding to the closed position to indicate that the processor is engaged by the processor socket, and second nomenclature corresponding to the open position to indicate that the processor is disengaged by the processor socket.

15. A system comprising:
a circuit board having a processor socket disposed thereon;
a processor releasably coupled to the processor socket;
a heat sink thermally coupled to the processor; and
an actuator rotatably coupled to the heat sink to facilitate engagement and disengagement of at least the heat sink with the processor socket,
wherein the heat sink comprises:
a base;
a plurality of crimped cooling fins thermally coupled to the base; and
a shroud coupled to at least the base and in communication with the actuator.

16. The system of claim 15, wherein the actuator comprises:
a first end adapted to engage a receptacle within the processor socket to urge the processor socket into either an open position in which the is engaged by the processor socket, or a closed position in which the processor is disengaged by the processor socket; and
a second end to indicate whether the processor socket is in the open or closed position.

17. The system of claim 16, wherein the actuator further comprises:
a first member and a second member pivotally coupled to each other at a pivot point between the first and second ends;
wherein the second member is pivotable from a first substantially vertical position to a second substantially horizontal position.

18. The system of claim 17, wherein the shroud is adapted to receive the second member in the second substantially horizontal position such that when in the second position, the actuator is prevented from causing the processor socket to disengage the processor.

19. The system of claim 16, wherein the shroud comprises first nomenclature corresponding to the closed position to indicate that the processor is engaged by the processor socket, and second nomenclature corresponding to the open position to indicate that the processor is disengaged by the processor socket.

20. The system of claim 15 wherein the system is a selected one of a group consisting of a network router, an audio/video controller, a DVD player, and a server.

21. A system comprising:
a bus;
a memory coupled to the bus; and
an electronic assembly coupled to the bus, the electronic assembly including
an integrated circuit socket,
an integrated circuit communicatively coupled with the bus via the integrated circuit socket, and
a heat sink releasably coupled to the integrated circuit socket and thermally coupled to the integrated circuit, the heat sink including an actuator to facilitate engagement and disengagement of at least the heat sink with the integrated circuit socket, wherein the actuator comprises
a first member having a first end and a second end, and
a second member having a third end and a fourth end, the second member pivotally coupled to the first member at the second and third ends, wherein the first end is adapted to engage a receptacle within the integrated circuit socket.

22. The system of claim 21, wherein the integrated circuit comprises a processor.

23. The system of claim 21, wherein the system is a selected one of a group consisting of a network router, an audio/video controller, a DVD player, and a server.

* * * * *

UNITED STATES PATENT AND TRADEMARK OFFICE
CERTIFICATE OF CORRECTION

PATENT NO. : 7,050,302 B2  Page 1 of 1
APPLICATION NO. : 10/836442
DATED : May 23, 2006
INVENTOR(S) : David J. Llapitan et al.

It is certified that error appears in the above-identified patent and that said Letters Patent is hereby corrected as shown below:

Col. 3, line 41 "...receptacle 310"..." should read --...receptacle 310.--;

Col. 3, line 65, "...handle 130..." should read --...handle 139...--;

Col. 7, line 32, "...in which the is engaged..." should read --...in which the processor is engaged...--;

Col. 8, line 12, "...claim 15 wherein,..." should read --...claim 15, wherein...--.

Signed and Sealed this

Sixth Day of October, 2009

David J. Kappos
*Director of the United States Patent and Trademark Office*